United States Patent
Ghanea-Hercock

(10) Patent No.: US 9,838,018 B2
(45) Date of Patent: Dec. 5, 2017

(54) PRINTED LOGIC GATE

(71) Applicant: BRITISH TELECOMMUNICATIONS PUBLIC LIMITED COMPANY, London (GB)

(72) Inventor: Robert Ghanea-Hercock, London (GB)

(73) Assignee: British Telecommunications PLC, London (GB)

( * ) Notice: Subject to any disclaimer, the term of this patent is extended or adjusted under 35 U.S.C. 154(b) by 0 days.

(21) Appl. No.: 15/190,540

(22) Filed: Jun. 23, 2016

(65) Prior Publication Data
US 2016/0380634 A1    Dec. 29, 2016

(30) Foreign Application Priority Data

Jun. 24, 2015    (EP) ..................................... 15275161

(51) Int. Cl.
H03K 19/00      (2006.01)
H03K 19/04      (2006.01)
(Continued)

(52) U.S. Cl.
CPC ........... *H03K 19/04* (2013.01); *B22F 3/1055* (2013.01); *B22F 5/00* (2013.01); *B23K 15/0086* (2013.01); *B23K 15/0093* (2013.01); *B23K 26/0006* (2013.01); *B23K 26/342* (2015.10); *B29C 64/106* (2017.08); *B29C 64/153* (2017.08); *B33Y 10/00* (2014.12); *B33Y 30/00* (2014.12); *B33Y 50/02* (2014.12); *B33Y 80/00* (2014.12); *C04B 35/62218* (2013.01);
(Continued)

(58) Field of Classification Search
CPC ...... B22F 3/1055; B22F 5/00; B22F 2998/10; B23K 15/0086; B23K 15/0093; B23K 26/0006; B23K 2201/42; B23K 2203/08; B29C 67/0055; B29C 67/0077; B33Y 10/00; B33Y 30/00; B33Y 50/02; B33Y 80/00; C04B 35/62218; C04B 35/62222; H01J 21/20; H03K 19/04; H03K 19/20
See application file for complete search history.

(56) References Cited

U.S. PATENT DOCUMENTS 2,797,389 A * 6/1957 Hegarty .................. H03K 7/02
                                        332/115
7,545,179 B2 * 6/2009 Diamant .............. H03K 17/545
                                        313/336
(Continued)

FOREIGN PATENT DOCUMENTS

JP           59100857 A * 6/1984 ............. G01N 27/66

OTHER PUBLICATIONS

Extended EP Search Report for EP 15275161.6, dated Dec. 16, 2015, 7 pages.

*Primary Examiner* — Alexander H Taningco
*Assistant Examiner* — Kurtis R Bahr
(74) *Attorney, Agent, or Firm* — Nixon & Vanderhye PC

(57) ABSTRACT

An additively manufactured apparatus having a gas filled sealed cavity containing at least two additively manufactured cathodes and an additively manufactured anode spaced from the cathodes such that a continuous electric discharge of the gas stimulated between at least one of the cathodes and the anode provides a Boolean function output at the anode corresponding to electrical input signals at two of the cathodes.

20 Claims, 12 Drawing Sheets

(51) Int. Cl.

| | | |
|---|---|---|
| *H01J 21/20* | (2006.01) | |
| *B33Y 10/00* | (2015.01) | |
| *B33Y 30/00* | (2015.01) | |
| *B33Y 50/02* | (2015.01) | |
| *B33Y 80/00* | (2015.01) | |
| *B23K 26/342* | (2014.01) | |
| *B22F 3/105* | (2006.01) | |
| *B22F 5/00* | (2006.01) | |
| *B23K 15/00* | (2006.01) | |
| *B23K 26/00* | (2014.01) | |
| *C04B 35/622* | (2006.01) | |
| *H03K 19/20* | (2006.01) | |
| *B29C 64/106* | (2017.01) | |
| *B29C 64/153* | (2017.01) | |
| *B23K 101/42* | (2006.01) | |
| *B23K 103/08* | (2006.01) | |

(52) U.S. Cl.
CPC ........ *C04B 35/62222* (2013.01); *H01J 21/20*
(2013.01); *H03K 19/20* (2013.01); *B22F*
*2301/05* (2013.01); *B22F 2998/10* (2013.01);
*B23K 2201/42* (2013.01); *B23K 2203/08*
(2013.01)

(56) References Cited

U.S. PATENT DOCUMENTS

| | | | | |
|---|---|---|---|---|
| 7,847,596 | B2 * | 12/2010 | Halahmi | H03K 17/545 |
| | | | | 313/336 |
| 8,330,492 | B2 * | 12/2012 | Umezaki | G09G 3/20 |
| | | | | 326/102 |
| 2014/0152383 | A1 | 6/2014 | Nikonov et al. | |
| 2015/0270089 | A1 * | 9/2015 | Ghanea-Hercock | H01J 19/04 |
| | | | | 313/308 |

* cited by examiner

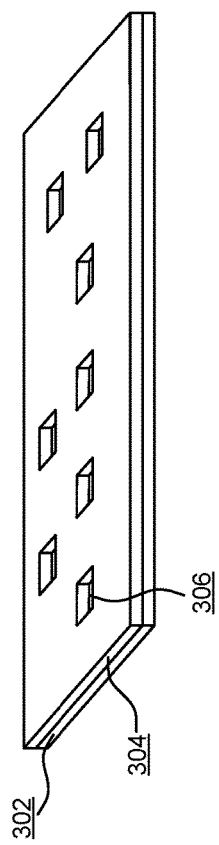
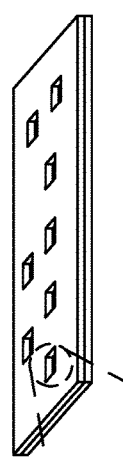
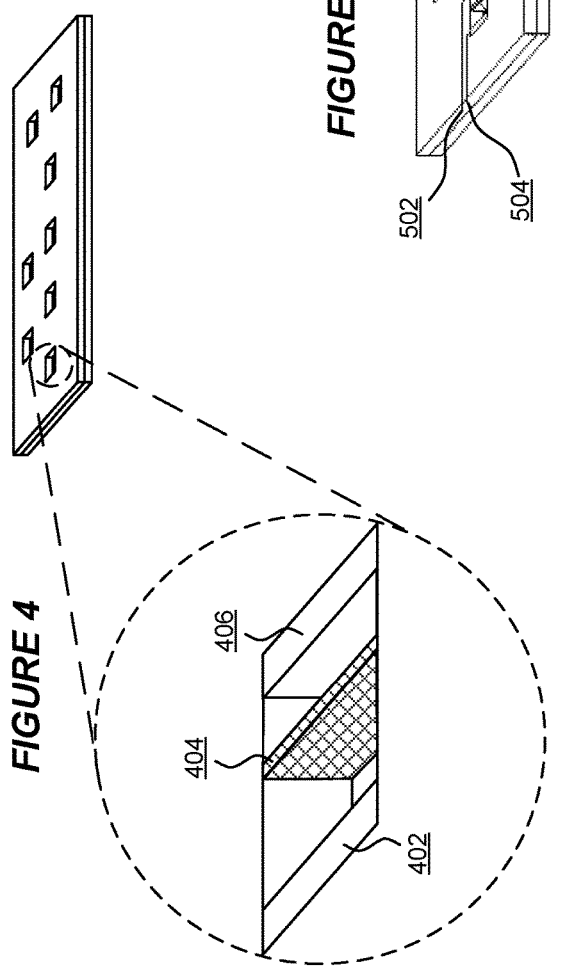
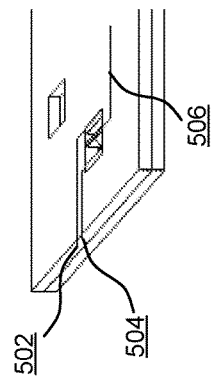

XOR gate

PRINTED LOGIC GATE

This application claims priority to EP Patent Application No. 15275161.6, filed 24 Jun. 2015, the entire contents of which is hereby incorporated by reference.

TECHNICAL FIELD

The present invention relates to the manufacture of logic gates. In particular it relates to the manufacture of a 3D printed article including a 3D printed logic gate integral with a fabric of the article.

BACKGROUND AND SUMMARY

Additive manufacturing, a type of which is known as three dimensional (3D) printing, is a process of manufacturing a three dimensional solid object from a model such as a digital model by an additive process in which material is layered, adhered, bonded or otherwise deposited successively until the solid object is formed. Such an approach is in contrast to traditional manufacturing techniques where articles are formed from the assembly of parts which themselves may be machined, cast or moulded.

Additive manufacturing provides numerous benefits over traditional manufacturing techniques, including technical benefits and commercial benefits. Technically, additive manufacturing allows virtually any arrangement of a three dimensional object to be created from a growing number of materials, including plastics, metals and ceramics. The arrangement can include complex features, even internally, since the additive approach to manufacturing is capable of generating complex structure. Additive approaches generate less waste compared to traditional approaches, provide increased consistency between articles of manufacture, improved speed of manufacture from initial design with minimal setup required, the advantages of novel structures and shapes and new combinations of materials.

Commercially, additive manufacturing provides considerable cost-savings over traditional manufacturing techniques, especially where a number of articles for manufacture is relatively small. For example, prototypes, proof-of-concepts, spare-parts and articles manufactured in isolated or remote locations, such as at sea or in orbit, are readily produced at low cost using additive manufacturing. The speed of manufacturing is also a benefit since a three dimensional article can be produced from a three dimensional design relatively rapidly and without bespoke or tailored rigging or manufacturing line.

Additive manufacturing covers a number of approaches. Extrusion deposition is an approach to additive manufacturing in which beads of material are extruded in a controlled manner either by way of a moveable extruder ("print-head"); a moveable table or support; or both. The extruded beads harden rapidly to form a layer or part of an article onto which further extrusion can take place. In this way the article is built-up additively.

An alternative approach is the selective fusing of granular materials such as a selective sintering or melting of metals or polymers. Using such an approach granular material is deposited in layers and selectively sintered, melted or bonded using, for example, convection heat, laser or electron beam. The selection is made based on a three dimensional model of the article in a layered manner. In this way the article is built-up additively.

Use of additive manufacturing to produce electrical or electronic devices has been severely constrained since additive manufacturing is not suitable for manufacturing complex modern electronic components from many disparate materials. While additive manufacturing has found applications in the printing of planar circuit board layouts with component sockets and interconnects in combination with trenches or routes for electrical connections, there is currently a requirement for placement, installation and/or assembly of electrical and electronic components following the additive manufacturing process. This requirement for post-manufacture assembly and/or installation has the considerable disadvantage that component locations, sockets and routes must be accessible in an additively-manufactured product. Accordingly, the hugely beneficial characteristics of additive-manufacturing of accurately producing complex, internalised and potentially inaccessible structures are entirely lost in the electronic field. Furthermore, the requirement for post-manufacture assembly and/or installation imposes burdens of additional manufacturing steps that considerably erode the benefits of additive manufacturing.

Thus it would be beneficial to produce electronic devices using additive manufacturing approaches without the aforementioned disadvantages.

The present invention accordingly provides, in a first aspect, A 3D printed apparatus having a gas filled sealed cavity containing at least two 3D printed cathodes and a 3D printed anode spaced from the cathodes such that a continuous electric discharge of the gas stimulated between at least one of the cathodes and the anode provides a Boolean function output at the anode corresponding to electrical input signals at two of the cathodes.

Thus, embodiments of the present invention provide for the production of a three dimensional article by way of the additive manufacturing process. The use of such a manufacturing process allows for the production of a three dimensional article having potentially complex internal characteristics with the integration of active and/or logic gate electronic components such as diodes, triodes and logic gates within the fabric of the article. Due to the production and integration of active electronic components as part of the article manufacturing process there is no requirement for post-production assembly or installation of electronic components. Thus, manufacture of articles with installed electronic components can occur contemporaneous with the manufacture of the substantive three dimensional structure of the article. This relieves the manufacturing process from considerations of post-production assembly and installation of electronic components, such as burden approaches of the prior art that require multi-part manufacture with accessible integration interfaces and the like. Further, the cost of manufacture is dramatically reduced due to the use of additive manufacturing process, especially where small numbers of articles are required such as in prototyping or proof-of-concept manufacture, or in remote or inaccessible locations such as in orbit or space.

The inclusion of logic gate electronic components within the fabric of a three dimensional article reduces the overall weight of the article due to the absence of additional components and/or appendages. Furthermore, articles can be made more streamlined, with electronic componentry embedded within the article, such as internally in an imperceivable, undetectable and/or unobtrusive location within the article. Where the active electronic component is embedded in the article, the component can be protected from exposure to fluids such as moisture or air. The ability of additive manufacturing to produce articles on the micro-scale provides for potentially 'intelligent' (in the sense of including electronic componentry) articles in all manner of applications, including: electronics embedded within cellular telephone cases or covers; electronics embedded within cable sheaths; electronics embedded within fabric or clothing; electronics embedded within cases, covers, walls or other structural elements of other devices such as consumer or entertainment devices; electronics in spare-parts; and the like.

The removal of the requirement for accessibility of an electrical circuit and component locations for post-manufacturing assembly or installation dramatically redefines how electrical circuits and electronic devices can be designed and implemented in articles of manufacture. Embodiments of the present invention provide for true three-dimensional arrangements of active and/or logical electronic components and the connections therebetween without a requirement for accessibility of individual components or connections. This provides for an increase in the efficient use of space or volume of an article, and potentially for the reuse of active electronic components where appropriate by circuits of the same device under control. Vertical interconnects can provide for three dimensional processing elements such as cubic or other three dimensional arrangements of electronic components and circuits. A layered architecture of electronic components can be produced with layers of active electronic components within a single three dimensional article. Common services such as provision of power, dissipation of power, dissipation of thermal energy and the like can be provided by strata of service layers included as part of the additive manufacturing process, such as metal layers for power supply or layers of thermally efficient conducting materials for heat dissipation or transfer. Conceivably, channels and conduits can be provided, manufactured as part of the additive manufacturing process, for the communication of fluids such as coolants or gases to further provide services to electronic components such as the transfer of heat from within the article, such as heat generated by the active electronic components.

A particular advantage of the use of thermionic and continuous electric discharge logic electronic components is the benefits of such components over silicon equivalents such as silicon transistors. Additively manufactured components in accordance with embodiments of the present invention have considerable robustness and provide improved analogue signal transfer properties.

Preferably the apparatus further comprises a 3D printed stabilising resistor as a resistive material electrically coupled to the anode to stabilise the continuous electric discharge.

Preferably the continuous electric discharge of the gas occurs as an electric arc.

Preferably the cavity contains two cathodes such that the Boolean function is an OR function.

Preferably the anode is an output anode and the at least two cathodes include: a control cathode spaced opposing the output anode; and a first and second input cathodes to receive the input signals via 3D printed electrical signal paths, the apparatus further comprising at least two drain anodes each spaced opposing a respective one of the input cathodes, wherein a potential difference between the control cathode and output anode stimulates the continuous electric discharge allowing current to flow therebetween, wherein a potential difference between one of the input cathodes and a respective drain anode is insufficient to deflect the continuous electric discharge allowing current to flow via the output anode, and wherein a potential difference between both of the input cathodes and the respective drain anodes is sufficient to deflect the continuous electric discharge preventing current flowing via the output anode, such that the Boolean function output at the anode corresponds to a logical NAND operation on the input signals at the input cathodes.

Preferably an axis through the control cathode and the output anode is substantially perpendicular to an axis between the first input cathode and respective drain cathode and also perpendicular to an axis between the second input cathode and respective drain anode.

Preferably the apparatus further comprises a 3D printed circuit.

The present invention accordingly provides, in a second aspect, a 3D printed article comprising one or more of the 3D printed apparatus described above as NAND gates within the fabric of the article wherein the NAND gates are arranged to form any number of one or more of: OR, NOT, AND, NOR and XOR logic gates.

The present invention accordingly provides, in a third aspect, a method of manufacturing an article with integral logic gate electronic component comprising: using an additive manufacturing process to: a) form an electrically non-conductive substrate; b) form an electrically non-conductive perforated layer having a cavity; c) form electrically conductive anode and cathode elements spaced in the cavity including at least two cathodes; d) deposit a conductive electrical connection to each of the elements sufficient to imparting an electrical potential difference between the elements; e) form an electrically non-conductive sealing layer atop the perforated layer so as to retain and seal the cavity in the perforated layer, wherein the cavity contains gas and wherein the electrical potential difference is sufficient to stimulate a continuous electric discharge of the gas between at least one of the cathodes and the anode to provide a Boolean function output at the anode corresponding to electrical input signals at two of the cathodes.

Preferably forming one or more of: the substrate; perforated layer; and sealing layer includes forming a channel providing fluid communication between the cavity and a fluid port of the article, wherein the fluid port via which the gas can be inserted into the cavity.

Preferably the additive manufacturing process takes place within a sealed atmosphere constituted substantially of an inert gas so as to encase the inert gas in the cavity on formation of the sealing layer.

Preferably the anode is positioned at a side of the cavity opposing a side at which the cathodes are positioned such that the logic gate constitutes a Boolean OR function of the electrical input signals.

Preferably the anode is an output anode and the at least two cathodes include: a control cathode formed spaced opposing the output anode; and a first and second input cathodes formed to receive the input signals via 3D printed electrical signal paths, the method further comprising forming at least two drain anodes each spaced opposing a respective one of the input cathodes, wherein a potential difference between the control cathode and output anode stimulates the continuous electric discharge allowing current to flow therebetween, wherein a potential difference between one of the input cathodes and a respective drain anode is insufficient to deflect the continuous electric discharge allowing current to flow via the output anode, and wherein a potential difference between both of the input cathodes and the respective drain anodes is sufficient to deflect the continuous electric discharge preventing current flowing via the output anode, such that the Boolean function output at the anode corresponds to a logical NAND operation on the input signals at the input cathodes.

Preferably the additive manufacturing process includes one or both of an extrusion deposition process and a granular material binding process.

Preferably at least one of the: electrically non-conductive substrate; perforated layer; and sealing layer are formed in ceramic.

Preferably at least one of the anode and the cathodes are formed from a gallium alloy.

The present invention accordingly provides, in a fourth aspect, an article with integral logic gate electronic component manufactured by the process described above.

The present invention accordingly provides, in a fifth aspect, an additive manufacturing apparatus for manufacturing an article with integral active electronic component, the apparatus comprising: a computer system; a first additive manufacturing component adapted to form electrically non-conductive three dimensional structures; a second additive manufacturing component adapted to form electrically conductive three dimensional structures; wherein the first and second additive manufacturing components are operable under control of the computer system, the computer system being adapted to control the components to: a) form an electrically non-conductive substrate; b) form an electrically non-conductive perforated layer having a cavity; c) form electrically conductive anode and cathode elements spaced in the cavity including at least two cathodes; d) deposit an electrically conductive electrical connection to each of the elements sufficient to imparting an electrical potential difference between the elements; e) form an electrically non-conductive sealing layer atop the perforated layer so as to retain and seal the cavity in the perforated layer, wherein the cavity contains gas and wherein the electrical potential difference is sufficient to stimulate a continuous electric discharge of the gas between at least one of the cathodes and the anode to provide a Boolean function output at the anode corresponding to electrical input signals at two of the cathodes.

The present invention accordingly provides, in a sixth aspect, a computer system for controlling an additive manufacturing apparatus, the additive manufacturing apparatus being adapted to manufacture three dimensional structures from both electrically non-conductive and electrically conductive materials, the computer system being operable to control the additive manufacturing apparatus to perform the method described above.

BRIEF DESCRIPTION OF THE DRAWINGS

Embodiments of the present invention will now be described, by way of example only, with reference to the accompanying drawings, in which:

FIG. 3 depicts an arrangement of an electrically non-conductive substrate having an electrically non-conductive perforated layer atop in accordance with embodiments of the present invention;

FIG. 4 depicts the arrangement of FIG. 3 having electrically conductive anode, cathode and grid elements formed in a cavity in accordance with embodiments of the present invention;

FIG. 5 depicts the arrangement of FIG. 4 having electrically conductive connections to each of the elements formed in the cavity in accordance with embodiments of the present invention;

DETAILED DESCRIPTION

Figure 1:
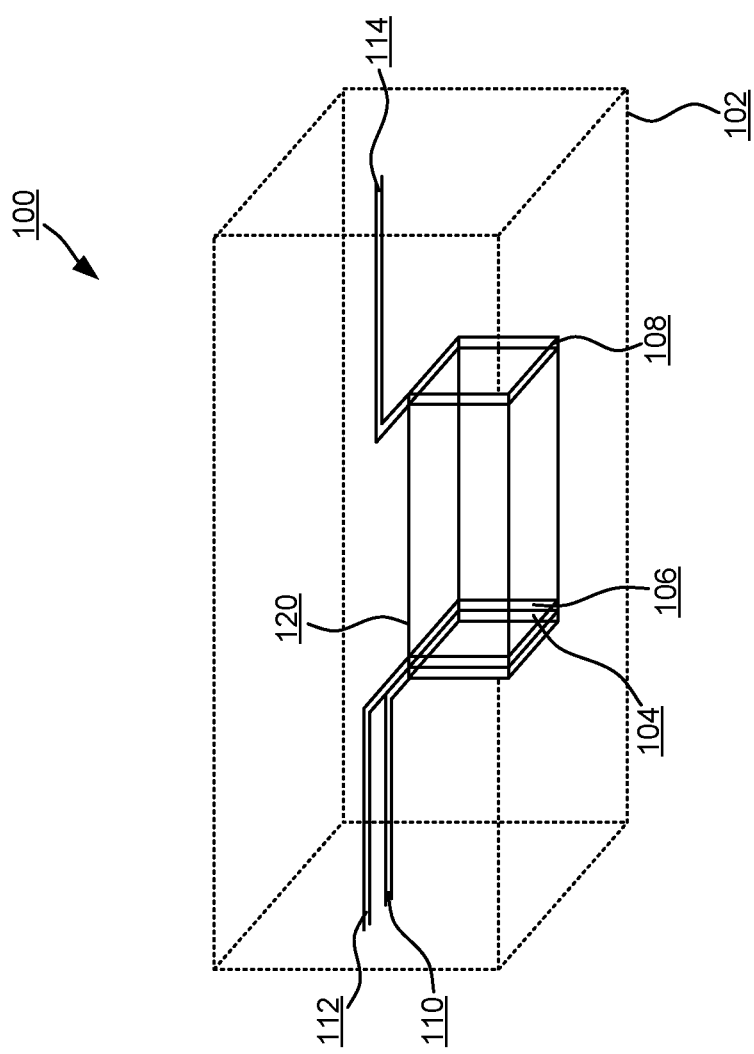
FIG. 1 depicts an exemplary three dimensional article with integral diode electronic component produced in accordance with embodiments of the present invention.

FIG. 1 depicts an exemplary three dimensional article 100 with integral diode 120 electronic component produced in accordance with embodiments of the present invention. The article 100 is constructed using an additive manufacturing approach including one or more techniques such as, inter alia: an extrusion deposition process; a material binding process such as selective laser sintering, direct metal laser sintering, selective laser melting or electron beam melting; and/or a stereolithographic approach such as photopolymerisation. Such techniques are also known as 3D printing, and a product or resulting article of such techniques is known as a 3D printed article or apparatus. The article 100 is comprised of a substantive structure 102 such as a body, framework, lattice, arrangement or other structure substantially constituting the article, otherwise referred to as the fabric of the article. For example, the article 100 can be, inter alia: a part; prototype; component; appliance; tool; cover; case; or model. The substantive structure 102 is formed from an electrically non-conductive material by the additive manufacturing process. For example, the substantive structure 102 is a plastic such as a polymer, and preferably a plastic able to tolerate high temperatures. Alternatively, the substantive structure 102 can be formed of a ceramic or similar material. Other electrically non-conductive materials suitable for forming the substantive structure 102 will be apparent to those skilled in the art.

The article 100 has formed within, and integral to, the substantive structure 102, an active electronic component as a diode 120. The diode 120 is integral to the fabric of the article 100 and is at least partly constituted by the substantive structure 102 of the article 100. It will be appreciated by those skilled in the art that an active electronic component, such as a diode, rectifier, triode and the like, is an electronic component that requires a power source for one or more of its functions, as distinct from a passive electronic component such as a resistor or capacitor, which requires no power source for operation. The diode 120 is formed in a cavity in the substantive structure 102 of the article 100. At one end of the cavity a cathode 106 is formed as an electrically conductive element. At the other end of the cavity, and spaced from the cathode 106, an anode 108 is formed as a second electrically conductive element. The cathode 106 and anode 108 are formed by an additive manufacturing process. In one embodiment the anode is formed by the 3D printing technique for liquid metal structures described by Ladd et al in "3D Printing of Free Standing Liquid Metal Microstructures" (Collin Ladd et al, Advanced Materials, Volume 25, Issue 36, pages 5081-5085, Sep. 25, 2013). Ladd et al describe an approach to extruding electrically conductive metal wires at room temperature. Such an approach is particularly suited to combination with extruding of other materials such as polymer extrusion. For example, the anode 108 can be constituted of a gallium alloy such as a binary eutectic alloy of gallium and indium which can be extruded in an additive manufacturing process at room temperature as described by Ladd et al. Additionally or alternatively, the cathode 106 and/or anode 108 are formed by a material binding process such as sintering. For example, direct metal laser sintering in which a laser is used to precisely and selectively sinter metal powder, can be employed for anode 108 and/or cathode 106 formation.

The cathode 106 is a hot cathode that heats to cause thermionic emission of electrons from the cathode 106. In one embodiment the cathode 106 also acts as a filament to achieve the required heating. Alternatively, a separate filament 104 is provided in thermal proximity to the cathode 106 so as to heat the cathode 106 to induce thermionic emission by the cathode 106. Preferably, cathode 106 is formed from an electrical conductor with a high heat resistance, such as tungsten or a tungsten alloy. Such materials are known to be formable by an additive manufacturing process such as a bonded tungsten 3D printing process as is available from ExOne Company (e.g. ExOne's M-Flex 3D printer).

Each of the anode 108 and cathode 106 are electrically connected to an electrically conductive connection 114, 112. The electrical connections 114, 112 are suitable for imparting an electrical potential difference between the anode 108 and cathode 106. For example, the anode 108 electrical connection 114 is connected to a source of positive electrical potential while the cathode 106 electrical connection 112 is connected to a source of relatively less electrical potential such as ground. Where provided, the filament 104 also has an electrical connection 110 for powering the filament to generate heat. The electrical connections 110, 112, 114 are formed as part of an additive manufacturing process such as the approach of Ladd et al described above, or any suitable approach to depositing electrically conductive connections by additive manufacturing while manufacturing the article 100.

Most preferably, the cavity formed for the diode 120 is a sealed vacuum, such as can be achieved by a manner described later. Alternatively, the cavity is sealed store of an inert gas such as a noble gas or nitrogen, the reactivity and effect of which on thermionic emission and transfer of electrons by and from the cathode is predictable and known. To ensure the provision of an inert gas in the cavity of the article 100, the additive manufacturing process for the article 100 can be performed in a sealed atmosphere constituted substantially, preferably entirely, of the inert gas so as to encase the inert gas in the cavity on sealing of the cavity.

Thus the article 100 includes an active electronic component as a diode 120. When a potential difference is imparted between the hot cathode 106 and the anode 108, electrons will travel from the cathode 106 to the anode 108 in the manner known from vacuum tube diodes.

Figure 2:
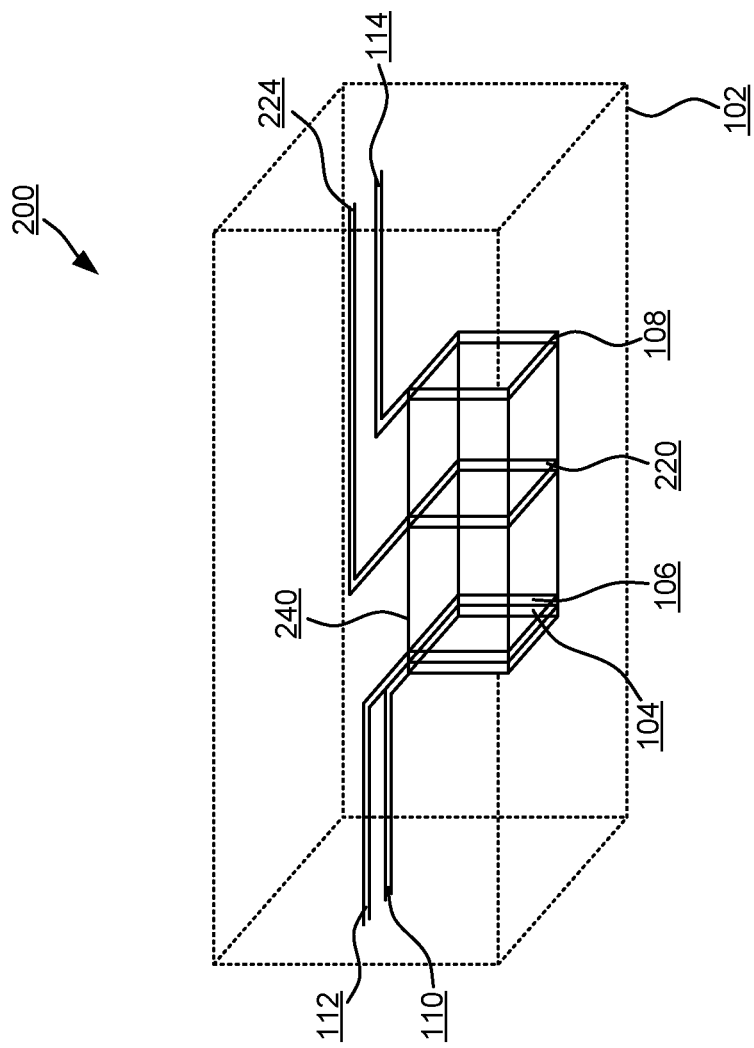
FIG. 2 depicts an exemplary three dimensional article with integral triode electronic component produced in accordance with embodiments of the present invention.

FIG. 2 depicts an exemplary three dimensional article 200 with integral triode 240 electronic component produced in accordance with embodiments of the present invention. Many of the features of FIG. 2 are identical to those described above with respect to FIG. 1 and these will not be repeated here. FIG. 2 further includes a grid 220 element as an electrically conductive element spaced from, and positioned between, the cathode 106 and the anode 108, with an associated deposited electrical connection 224 for providing an electrical signal to the grid 220. The grid 220 is traversable by electrons arising from thermionic emission of the cathode 106 and the grid 220 regulates the transmission of electrons from the cathode 106 to the anode 108 depending on the electrical potential of the grid 220 determined by the electrical signal. Such a grid 220 is formed as part of the additive manufacturing process for the article 200, such as by the approach of Ladd et al described above which is particularly suited to creating a grid, lattice or array arrangement of electrically conductive elements.

Thus the article 200 includes an active electronic component as a triode 240. When a potential difference is imparted between the hot cathode 106 and the anode 108, electrons will travel from the cathode 106 to the anode 108 regulated by an electrical potential at the grid 220 determined by an electrical signal for the grid 220, in the manner known from vacuum tube triodes or valves.

Thus embodiments of the present invention arranged according to FIG. 1 or FIG. 2 provide a 3D printed article or apparatus 100, 200 comprising a 3D printed thermionic electronic component 120, 240 integral with a fabric 102 of the apparatus 100, 200. The thermionic electronic component 120, 240 is a diode comprising a cathode 106 and an anode 108, or a triode comprising a cathode 106, an anode 108 and a grid 220 to regulate the passage of electrons from the cathode to the anode. The apparatus 100, 200 can further include a 3D printed circuit by way of electrically conductive connections 110, 112, 114, 224 connecting external to the apparatus or, conceivably, to other active electronic components elsewhere in the apparatus 100, 200.

An exemplary method of additive manufacture of an article such as article 100 or article 200 will now be described. FIG. 3 depicts an arrangement of an electrically non-conductive substrate 302 having an electrically non-conductive perforated layer 304 atop in accordance with embodiments of the present invention. The substrate 302 is initially formed from an electrically non-conductive material such as a plastic, polymer or ceramic using an additive manufacturing process such as hereinbefore described. Subsequently, the perforated layer 304 is formed atop the substrate using a similar manufacturing process to that of the substrate except that one or more cavities 306 are formed in the perforated layer 304. The cavities 306 are illustrated as rectangular in shape though it will be appreciated that any shape can be used. In one embodiment, the formation of the cavities 306 is achieved by defining a digital model of the perforated layer 304, including definitions of the cavities 306 or definitions of the perforated layer 304 in which the cavities are apparent by the absence of material therein, and interpretation of the digital model by a control apparatus or process of an additive manufacturing process so as to control the additive manufacturing process to obtain the cavities 306 such as by way of omitting to extrude or bond electrically non-conductive material in the locations of the cavities 306.

FIG. 4 depicts the arrangement of FIG. 3 having electrically conductive cathode 402, anode 406 and grid 404 elements formed in a cavity in accordance with embodiments of the present invention. An additive manufacturing process is used to form the cathode 402, anode 406 and (optionally) grid 404 as electrically conductive elements described above. For example, the approach of Ladd et al is used to provide the anode 406 and grid 404. The cathode 402 can be provided by bonded tungsten 3D printing using a sintering technique such as direct metal laser sintering. While FIG. 4 is illustrated with a grid 404 element, it will be appreciated that the production of a diode active electronic component would not require the grid 404 element. Further, it will be appreciated that a separate filament could additionally be provided in the cavity in thermal proximity with the cathode 402. FIG. 5 depicts the arrangement of FIG. 4 having electrically conductive connections 502, 504, 506 to each of the elements 402, 404, 406 formed in the cavity 306 in accordance with embodiments of the present invention. The electrically conductive connections 502, 504, 506 are preferably provided by the approach of Ladd et al described above. It will be appreciated that while the formation of the perforated layer and the electrically conductive elements are described as separate steps, such steps could be conducted contemporaneously or in turn as part of a single additive manufacturing process, such as by deposition processes employing multiple materials or a combination deposition and sintering process.

Figure 6:
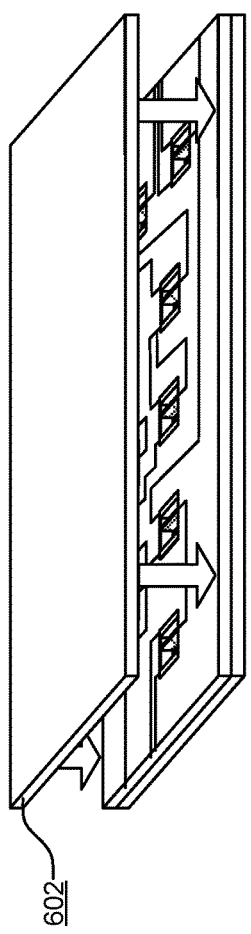
FIG. 6 depicts the arrangement of FIG. 5 having an electrically non-conductive sealing layer formed atop the perforated layer in accordance with embodiments of the present invention.

FIG. 6 depicts the arrangement of FIG. 5 having an electrically non-conductive sealing layer 602 formed atop the perforated layer 304 in accordance with embodiments of the present invention. The electrically non-conductive sealing layer 602 is formed in a similar manner, and using similar or identical materials, to the substrate 302 and perforated layer 304. The sealing layer 602 serves to retain and seal the cavities 306 in the perforated layer 304. In one embodiment, at least the sealing layer 602 is formed while the article of manufacture is enclosed within in a sealed atmosphere constituted of a noble gas and the sealing of the cavities 306 is hermetic so that there is no fluid communication into or out of the cavities 306.

Figure 7:
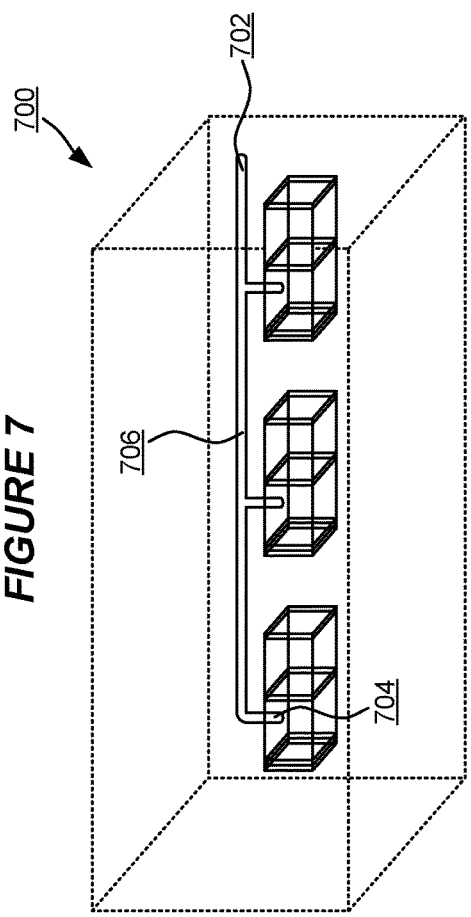
FIG. 7 depicts an exemplary three dimensional article with integral active electronic components and having a channel to an evacuation port of the article in accordance with embodiments of the present invention.

In an alternative embodiment, the sealing layer 602 does not hermetically seal the cavities, as will be described with respect to FIG. 7. FIG. 7 depicts an exemplary three dimensional article 700 with integral active electronic components and having a channel 706 to an evacuation port 702 of the article in accordance with embodiments of the present invention. The article 700 is manufactured by an additive manufacturing process as hereinbefore described such that the integral active electronic components are integral with a fabric of the apparatus 700. Additionally, the additive manufacturing process is adapted to form the channel 706 for fluid communication between a cavity of (potentially multiple) active electronic components and the evacuation port 702. The channel 706 can be formed in any, or multiple, of the substrate 302, the perforated layer 304 or the sealing layer 602, and a direction, path or route of the channel 706 is not limited except that the channel 706 cannot interrupt any electrically conductive connection in the article 700. The channel 706 interfaces with each electronic component via an opening 704 into the cavity of the electronic component. The evacuation port 702 is provided at one end of the channel 706, or at a point along the channel 706, in order to effect the evacuation of gas from the channel 706 and the cavities of active electronic components in the article 700. The evacuation can be achieved by use of a vacuum pump or the like, and is followed by sealing the evacuation port 702 in order to maintain vacuum-like conditions in the cavities of the active electronic devices. Preferably, the cavities contain a vacuum in order to improve the transmission of electrons arising from the thermionic emission at the cathode 402.

Figure 8:
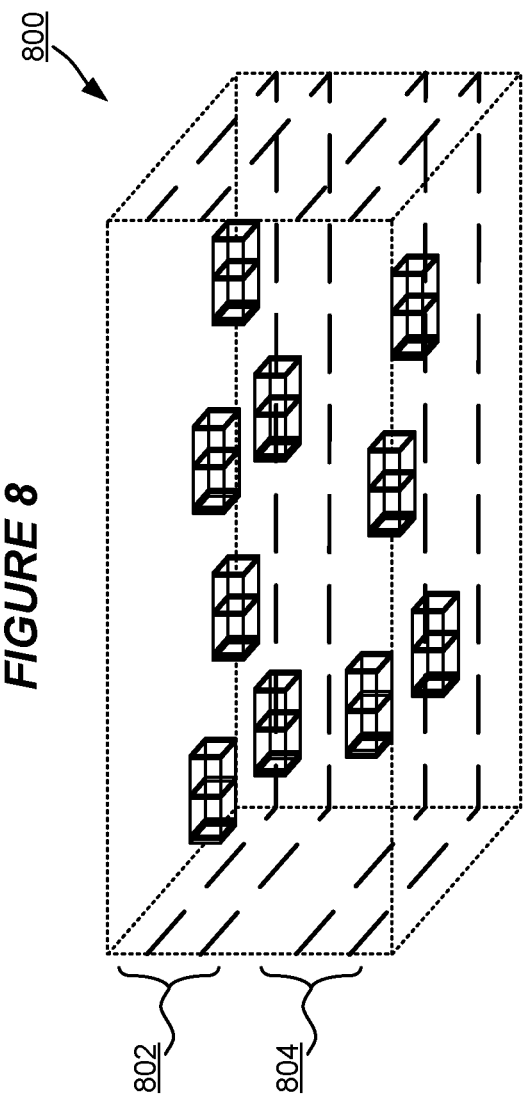
FIG. 8 depicts an exemplary three dimensional article with integrated active electronic components disposed in a layers in accordance with embodiments of the present invention.

FIG. 8 depicts an exemplary three dimensional article 800 with integrated active electronic components disposed in a layers 802, 804 in accordance with embodiments of the present invention. Due to the additive manufacturing process employed to manufacture articles in accordance with embodiments of the present invention, the scope for novel, efficient and effective arrangements of active electronic components is increased. FIG. 8 illustrates how such components can be arranged in layers 802, 804 so as to stratify the article 800, with potentially electrical connection between electronic components occurring intra-layer and inter-layer, and potentially spanning many layers. Such connections can be modelled by a 3D model of the article 800 and can be generated as part of the additive manufacturing process irrespective of the direction in which such connections occur. Similarly, the orientation, shape and dimensions of the active electronic components themselves can be adapted, varied, configured and/or tailored depending on the requirements of the article 800.

It will be appreciated that passive electronic components can also be formed as part of an additive manufacturing process, such as resistors and capacitors. Such passive components are relatively straightforward to manufacture. For example, a resistor can be formed as a solid printed blocks of ceramic material. A means of insulation of the passive component from the substantive body of the article may be required and can be achieved by enclosing such components in cavities within an article, suspended or held in place by electrical connections. Similarly, capacitors can be created using a structure similar to the active electronic devices except with 2 parallel metallic plates deposited within the cavity. Thus active and passive components required for substantially all electronic and logic requirements of an electronic apparatus can be formed integrally within a three dimensional article using the additive manufacturing approach.

Figure 9:
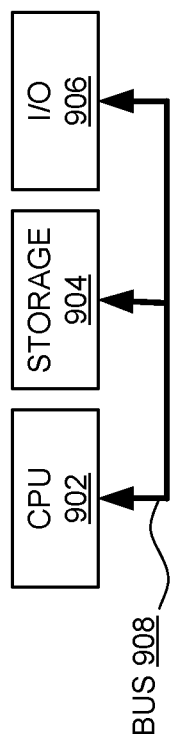
FIG. 9 is a block diagram of a computer system suitable for controlling the operation of an additive manufacturing machine in accordance with embodiments of the present invention.

FIG. 9 is a block diagram of a computer system suitable for controlling the operation of an additive manufacturing machine in accordance with embodiments of the present invention. A central processor unit (CPU) 902 is communicatively connected to a storage 904 and an input/output (I/O) interface 906 via a data bus 908. The storage 904 can be any read/write storage device such as a random access memory (RAM) or a non-volatile storage device. An example of a non-volatile storage device includes a disk or tape storage device. The I/O interface 906 is an interface to devices for the input or output of data, or for both input and output of data. Examples of I/O devices connectable to I/O interface 906 include a keyboard, a mouse, a display (such as a monitor) and a network connection.

Figure 10:
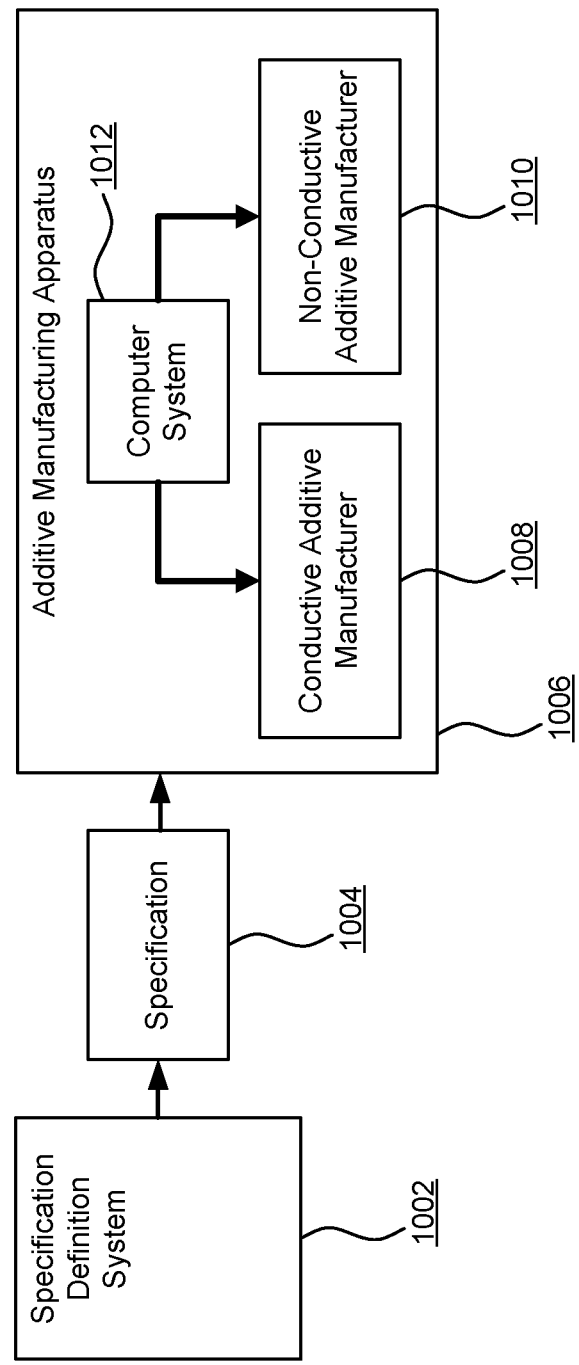
FIG. 10 is a component diagram of an additive manufacturing apparatus in accordance with embodiments of the present invention.

FIG. 10 is a component diagram of an additive manufacturing apparatus 1006 in accordance with embodiments of the present invention. The additive manufacturing apparatus 1006 is a combination apparatus including a conductive additive manufacturer 1008 for forming three dimensional structures from electrically conductive material, and a non-conductive additive manufacturer 1010 for forming three dimensional structures from electrically non-conductive material. Manufacturers 1008 and 1010 are arranged so as to operate on the same subject article during manufacture such that the article can be subject to either or both the manufacture of electrically conductive content or electrically non-conductive content. It will be appreciated by those skilled in the art that the two manufacturers 1008 and 1010 can be combined or integrated into a single component capable of operating in multiple modes of capable of accommodating both electrically conductive and non-conductive materials. The two manufacturers 1008 and 1010 operate in synchronisation and/or contemporaneously or a mixture of both synchronised and contemporaneous modes. For example, where a conductive additive manufacturing process occurs such that a non-conductive process could occur at the same time, then a contemporaneous mode of operation can be employed (though not necessarily). The operation of the manufacturers 1008 and 1010 is preferably computer controlled. In the embodiment of FIG. 10, a computer system 1012 is communicatively connected to the conductive additive manufacturer 1008 and the non-conductive additive manufacturer 1010 for instructing each of the manufacturers 1008 and 1010 as to additive manufacturing operations that are to be undertaken. The computer system 1012 is responsive to a specification 1004 for an article for manufacture. In one embodiment the specification 1004 is a digital representation of a three dimensional specification of an article for manufacture. For example, for an extrusion-based manufacturing process, the specification can include a definition of the materials for extrusion and the locations, positions, arrangements or configurations of one or more extruding heads, heads for a binder, setter, epoxy or the like and/or a table, workpiece or article holder. The manufacturing process can be defined using vector definitions specifying the discrete or relative movement or relocation etc. Alternatively, in a granular fusing based additive manufacturing approach, a location of fusing, binding, heating or the like can be specified by the specification 1004, such as by way of control instructions for a laser or similar fusion mechanism. In embodiments of the present invention, the specification 1004 is in the form of the Additive Manufacturing File format (AMF) or a Stereolithography file format (STL).

The specification 1004 is provided by a specification definition system 1002 such as a 3D modelling system, a computer aided design (CAD) or computer aided manufacturing (CAM) system as are known in the art. Such systems can be adapted to generate the specification 1004 in an AMF or STL format. Such formats can be adapted to include additional information relating to electronic circuit elements such as active and passive components and electrical connections therebetween.

Figure 11:
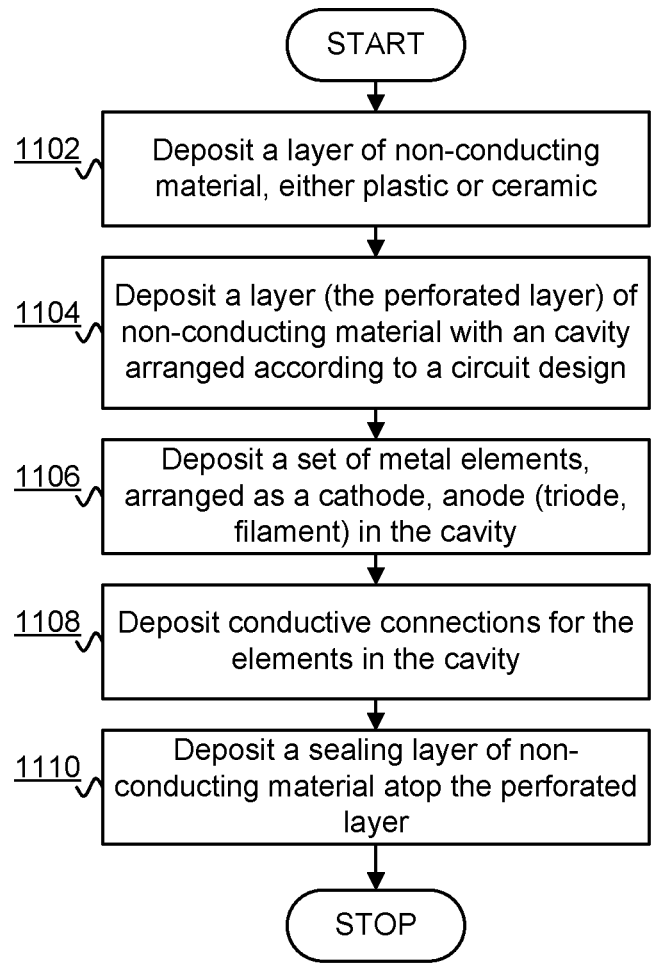
FIG. 11 is a flowchart of a method of manufacturing an article with integral active electronic component in accordance with embodiments of the present invention.

FIG. 11 is a flowchart of a method of manufacturing an article with integral active electronic component in accordance with embodiments of the present invention. Initially, at step 1102, a layer of non-conducting material is deposited by an additive manufacturing process as a substrate 302, such as a plastic or ceramic layer. At step 1104 a layer of non-conducting material with one or more cavities 306 is deposited by an additive manufacturing process as a perforated layer 304. The configuration of the cavities 306 are defined by a circuit design included in a specification 1004 of an article for manufacture. At step 1106 a set of metal elements are deposited in the cavity 306 by an additive manufacturing process arranged as a cathode, anode and, as required, a filament and grid (triode). At step 1108 electrically conductive connections for the elements in the cavity 306 are deposited by an additive manufacturing process. At step 1110 a sealing layer 602 is deposited atop the perforated layer 304.

Figure 12:
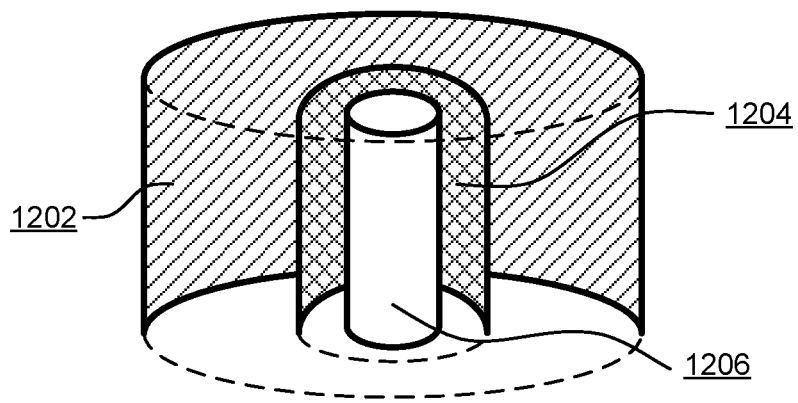
FIG. 12 depicts an arrangement of an active electronic component disposed in a cavity of an article in accordance with embodiments of the present invention.

FIG. 12 depicts an arrangement of an active electronic component disposed in a cavity of an article in accordance with embodiments of the present invention. Previously, the cavities 306 have been illustrated as generally rectangular in shape. FIG. 12 illustrates one alternative configuration of a cavity having a generally circular cross section and being generally cylindrical in shape. In the arrangement of FIG. 12 a cathode 1206 is arranged centrally in the cavity and an anode 1202 is arranged to occupy at least part of, and potentially all of, a wall of the cavity. The cathode 1206 can be further provided with a filament disposed about a central longitudinal axis of the cathode 1206. The arrangement of FIG. 12 is preferable where the electrically non-conductive substrate 302, perforated layer 304 and/or sealing layer 602 are less able to tolerate high temperatures, such as certain plastics and polymers, since a filament can be disposed away from the walls of the cavity and, if configured appropriately and supported such as by electrical connection means, also away from the substrate and sealing layer 602, by being substantially centrally disposed in the centrally positioned cathode 1206. Additionally, in a triode arrangement, a grid 1204 is provided in a concentric arrangement about the cathode 1206 to regulate a flow of electrons arising due to thermionic emission from the hot cathode 1206 to the anode 1202.

As will be appreciated by those skilled in the art, diodes such as those described here are suitable for the construction of logic gates, particularly logical AND and OR gates. Further, triodes such as those described here are suitable for the construction of NOR and NAND gates. Accordingly a full complement of logic functions are available by way of the additively manufactured active electronic devices such that resulting articles can include logic processing means, for example for switching, signal and/or data processing applications.

In a further embodiment of the present invention a cold cathode is employed with a gas dielectric occupying the cavity such that an electrical potential difference between the cathode and an anode causes gas ionisation and a flow of electrical current through the gas. In particular, the potential difference is adapted to generate an electric field to induce a sufficient current density and ionisation for a continuous electric discharge between the cathode and anode. Such a continuous electric discharge can manifest as an electrical arc. An arc can be obtained within the cavity with a potential difference between the cathode and anode in the region of hundreds of volts, such as between 100 and 300 volts. In an alternating current system a frequency of thousands of hertz, such as between 2000 and 5000 hertz, can suffice. The arc will exhibit negative voltage-current characteristics such that the potential difference across the arc decreases and the current increases—limited only by a supply. Accordingly, to provide a sustained arc it is necessary to provide a resistor or other stabilising device in the circuit of the arc. Notably resistive materials can be provided as part of an additive manufacturing process. Where multiple such arcs are formed in gaseous continuous electric discharge between cathodes and anodes within the cavity, each arc repels each other arc. Such repulsion is exploited by embodiments of the present invention to provide logic electronic components for performing logical operations within the fabric of additively manufactured devices as described below.

Figure 13:
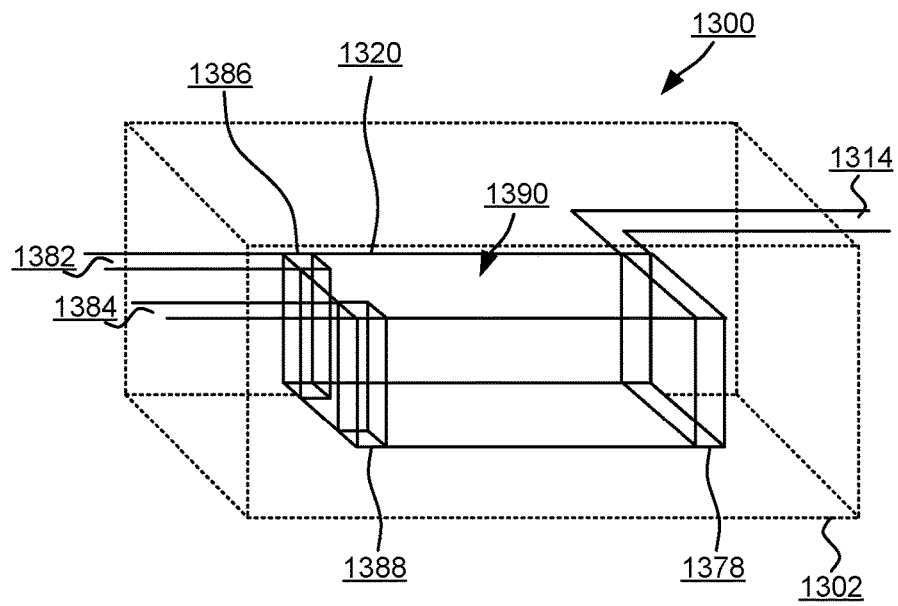
FIG. 13 depicts an exemplary three dimensional article with integral logic gate electronic component produced in accordance with embodiments of the present invention.

FIG. 13 depicts an exemplary three dimensional article 1300 with integral logic gate electronic component 1320 produced in accordance with embodiments of the present invention. The article 1300 is constructed using an additive manufacturing approach such as those previously described. The article 1300 is comprised of a substantive structure 1302 formed of an electrically non-conductive material such as a body, framework, lattice, arrangement or other structure substantially constituting the article, otherwise referred to as the fabric of the article. Preferably the substantive structure 1302 is formed of a thermally tolerant material able to tolerate high temperatures that may arise from a continuous electric discharge process. For example, the substantive structure 1302 is a ceramic or similar material.

The exemplary article 1300 of FIG. 13 has formed within, and integral to, the substantive structure 1302, a logical OR gate electronic component 1320 suitable for performing a logical "OR" operation. The OR gate 1320 is integral to the fabric of the article 1300 and is at least partly constituted by the substantive structure 1302 of the article 1300. The OR gate 1320 of FIG. 13 is one illustrative logic component for undertaking a logical "OR" operation, though it will be appreciated by those skilled in the art that other logical operations could alternatively be implemented as described in detail below.

The OR gate 1320 is formed in a cavity 1390 in the substantive structure 1302 of the article 1300. The cavity 1390 is filled with gas. Preferably the gas includes one or more inert gases such as noble gases. At one end of the cavity 1390 a pair of cathodes 1386, 1388 are formed as electrically conductive elements. Each of the cathodes 1386, 1388 respectively are electrically connected to input signal lines 1382, 1384 for receiving input signals for a logical OR operation by the OR gate 1320. Spaced from the cathodes 1386, 1388 is formed an anode 1378 as a second electrically conductive element. The anode 1378 is electrically connected to output signal line 1314 for providing an output signal from the logical OR operation by the OR gate 1320. The cathodes 1386, 1388 and anode 1378 are formed by an additive manufacturing process as hereinbefore described.

The cathodes 1386, 1388 are cold cathodes and potential differences can be applied between each cathode 1386, 1388 and the anode 1378 via the signal lines 1382, 1384 and 1314. Preferably a stabilising resistor (not illustrated) is provided, such as a resistor connected to the anode 1378 by way of the electrical connection 1314. Such a resistor can be provided as an additively manufactured resistor such as a deposition of a suitable electrically resistive material electrically coupled to the anode 1378 by way of the connection 1314.

A potential difference is applied between a cathode and the anode 1378 to indicate an input value of HIGH or binary value 1 to the OR gate 1320 at the respective cathode. Such potential difference causes ionisation of the gas in the cavity 1390 and the potential difference is chosen to cause continuous electric discharge between a cathode and the anode 1378 as an electric arc, such potential difference also being referred to herein as the breakdown voltage. Accordingly, where such potential difference is provided between only one of the cathodes 1386, 1388 and the anode 1378 then the resulting arc provides an electrical connection and current flows between the one cathode and the anode 1378. Accordingly the output of the OR gate 1378 provided via the connection 1314 is HIGH or binary value 1. In contrast, where no such potential difference is provided between any of the cathodes 1386, 1388 and the anode 1378 (indicating two input values of LOW or binary 0) then no ionisation occurs and no current flows. Accordingly, the output of the OR gate 1378 is LOW or binary value 0. Further, where a breakdown voltage exists between each of the cathodes 1382, 1384 (i.e. both cathodes) and the anode 1378 then the potential for multiple continuous electric discharges arises—one from each cathode to the anode 1378. The charge flow characteristics of arcs are such that each arc repels the other and a critical race condition ensues. To achieve appropriate OR gate logic behaviour in the event of two HIGH or binary 1 inputs at lines 1382 and 1384, current must flow to the anode 1378 and thus one arc must complete an electrical connection between a cathode and the anode 1378. Depending on the construction of the OR gate 1320 and the relative positioning of the cathodes 1382, 1384 and the anode 1378 the presence of a continuous electric discharge can be guaranteed under such circumstances. For example, a continuous electric discharge can be assured in the event of a race condition by positioning one of the cathodes relatively closer to the anode 1378 than the other. Alternatively a distinction can be made between the potential differences between each cathode and the anode 1378 to ensure one arc dominates. For example, such a distinction in potential difference can be provided by inclusion of a relatively small resistor in the circuit of one of the cathodes. Thus in this way an additively manufactured apparatus in accordance with the structure of FIG. 13 provides a single-structure OR gate logic internal to the apparatus. Such logic can be manufactured on-demand as part of an additive manufacturing process and is integral to an article of manufacture.

Practically the cavity 1390 must be dimensioned such that an electrical arc can form within the cavity. Research shows that a cavity having dimensions in all directions of around 2 mm may provide sufficient gap for the formation of a continuous electrical arc.

Figure 14A:
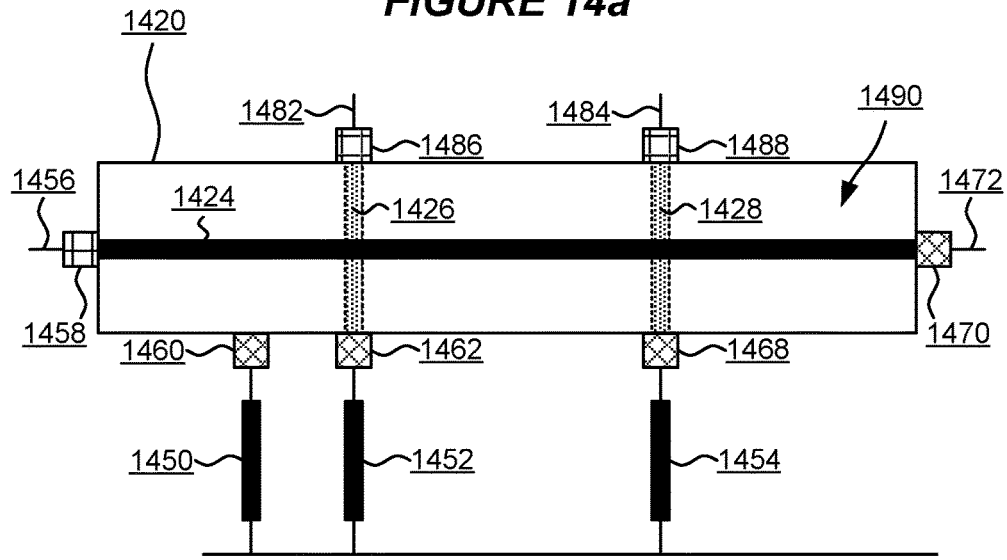
FIG. 14a is a schematic illustration of a logic gate electronic component suitable for production by additive manufacturing processes in accordance with embodiments of the present invention.

Different arrangements of cathodes and anodes inside the logic gate 1320 can provide different logical operations or other processing operations as required. FIG. 14a is a schematic illustration of a logic gate electronic component 1420 suitable for production by additive manufacturing processes in accordance with embodiments of the present invention. It will be appreciated that while the logic gate 1420 of FIG. 14a is not illustrated as part of a three dimensional article, the logic gate 1420 is constituted as an integral part of the fabric of an additively manufactured article such as the active electronic components and logic gates previously described. FIG. 14a and the associated description here serve to detail an arrangement in accordance with a preferred embodiment in which particular logical operations are provided.

The logic gate 1420 of FIG. 14*a* provides a NOT-AND or NAND logical operation. A cavity 1490 is provided by an additive manufacturing process in a three dimensional article as hereinbefore described. The cavity 1490 contains gas such as at least partly inert gas or a mixture of gases. Such gas or gases can be provided in the cavity 1490 by manufacture in an appropriate gaseous environment or by the provision of fluid communication means such as sealable channels for filling or replacing the contents of the cavity 1490 after manufacture as previously described. Cathodes 1458, 1486, 1488 (being identified by lateral hatching in FIG. 14*a*) are provided by the additive manufacturing process in positions to be described below. Similarly, anodes 1460, 1462, 1468, 1470 (being identified by diagonal hatching in FIG. 14*a*) are provided by the additive manufacturing process in positions to be described below. Each of three of the anodes 1460, 1462, 1468 is electrically connected to a resistor such as load resistors 1450, 1452, 1454 respectively. Additional resistors or other stabilising components may be employed in electrical connection with the anodes 1460, 1462, 1468 and the anode 1470 to stabilise a continuous electric discharge such as an electric arc occurring between a cathode and an anode.

Structurally, a steady state cathode 1458 (or control cathode) is disposed spaced and opposed an output anode 1470. The output anode 1470 provides an output from the NAND gate 1420 and, in use, a consistent potential difference is provided via connection 1456 between the steady state cathode 1458 and the output anode 1470 to ensure a continuous electric discharge between the steady state cathode 1458 and the output anode 1470, referred to hereafter as a 'steady state arc'. Such steady state arc results in current flowing between the steady state cathode 1458 and the output anode 1470. In a preferred embodiment, to ensure a continuous electric discharge occurs between the steady state cathode 1458 and the output anode 1470 (as opposed to via any of the other anodes 1450, 1452, 1454), a biasing negative voltage can be applied to the output anode 1470 via output electrical connection 1472.

Cathodes 1482 and 1484 are input cathodes corresponding to input values received by the NAND gate 1420. Each cathode 1482, 1484 has a respective opposed and spaced drain anode 1462, 1468. Accordingly, when a relatively HIGH potential difference (indicative of a binary value 1 at input 1482) is provided between cathode 1486 and respective opposed anode 1462 then conditions for a continuous electric discharge (arc) exist between them. Similarly, when a relatively HIGH potential difference (indicative of a binary value 1 at input 1484) is provided between cathode 1488 and respective opposed anode 1468 then conditions for a continuous electric discharge (arc) exist between them. Notably, the potential difference applied between input cathodes 1486, 1488 and respective anodes 1462, 1468 when a HIGH signal (binary 1) is indicated via electrical connections 1482, 1484 is relatively lower than the potential difference between the steady state cathode 1458 and the output anode 1470. Such relatively lower potential difference between input cathodes 1486, 1488 and respective anodes 1462, 1468 ensures that no continuous electric discharge (arc) can form between only one of the input cathodes 1486, 1488 and the respective anodes 1462, 1468 due to the presence of the steady state arc arising from the relatively higher potential difference between the steady state cathode 1458 and the output anode 1470. On the other hand, where HIGH signals (binary values 1) provide potential differences between both input cathodes 1486, 1488 and respective anodes 1462, 1468 then the formation of two discrete continuous electric discharges through the gas in cavity 1490 between the input cathodes 1486, 1488 and respective anodes 1462, 1468 are sufficient to overcome the steady state arc (by arc repulsion) and disconnect the steady state cathode 1458 from the output anode 1470. In a preferred embodiment the arrangement of the cathodes and anodes are such that an axis through the steady state cathode 1458 and spaced opposed output anode 1470 is perpendicular or substantially perpendicular to an axis between the first input cathode 1486 and respective drain anode 1462 and also perpendicular to an axis between the second input cathode 1488 and respective drain anode 1468. Notably the logic gate 1420 of FIG. 14*a* is formed in a three dimensional structure and accordingly the planes of any or each of the above axes may differ.

The arrangement of FIG. 14*a* is idealistic though in practice it presents a number of challenges. In particular it is necessary, in FIG. 14*a*, to ensure the steady-state arc 1424 between the steady state cathode 1458 and the output anode 1470 is maintained without deviation to any other anode such as drain anodes 1462 and 1468. Further it is necessary to ensure that the potential differences between respective input cathode/drain anode pairs 1486,1462 and 1488,1468 are sufficient in combination to deflect the steady-state arc 1424 but insufficient individually to do so. Various alternative exemplary arrangements are described below that seek to address these implementation challenges.

Figure 14B:
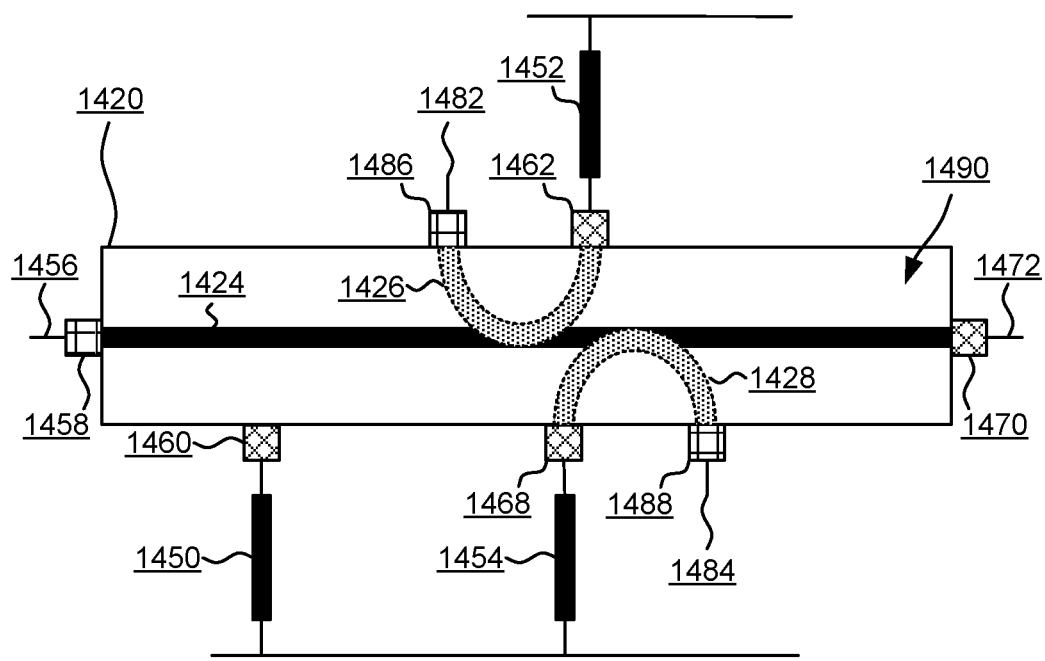
FIG. 14b is a schematic illustration of a logic gate electronic component suitable for production by additive manufacturing processes in accordance with a first alternative embodiment of the present invention.

FIG. 14*b* is a schematic illustration of a logic gate electronic component suitable for production by additive manufacturing processes in accordance with a first alternative embodiment of the present invention. Many of the elements of FIG. 14*b* are identical to like-numbered features of FIG. 14*a* though in FIG. 14*b* these features are arranged differently. In FIG. 14*b* the input cathode 1486 is disposed adjacent and on the same side of the cavity 1490 as corresponding drain anode 1462, and input cathode 1468 is disposed adjacent and on the same wall as corresponding drain anode 1488 with both input cathode/drain anode pair on opposite sides of the cavity 1490. In particular, the input cathode/drain anode pairs on opposite sides of the cavity 1490 are offset such that the anodes 1462, 1468 are directly or almost directly opposite each other while the cathodes 1486, 1488 are laterally offset from the anodes 1462, 1468 in a direction away from the anodes 1462, 1468 such that the cathodes 1486, 1488 are laterally relatively distant from each other on opposite sides of the cavity 1490. Thus in use in the arrangement of FIG. 14*b* an absence of a potential difference between the input cathodes 1486, 1488 and the drain anodes 1462, 1468 permits good flow of the steady-state arc 1424. A potential difference between one of the input cathodes 1486, 1488 and one of the drain anodes 1462, 1468 will provide a single arc (e.g. 1426) originating and terminating at the same side of the cavity. Such a single arc is insufficient to deviate the steady-state arc 1424. However if a potential difference is provided between both of the input cathodes 1486, 1488 and their respective drain anodes 1462, 1468 then two arcs 1426, 1428 are generated, each originating and terminating at the same side of the cavity. Due to the opposing nature of the drain anodes 1462, 1468 conditions are provided between the two arcs 1426, 1428 that repel the steady-state arc 1424, such as to the anode 1460. In this way the deviation of the steady-state arc 1424 can be provided. Furthermore, the drain anodes 1462, 1468 can be provided with a relatively higher potential than the output anode 1470, along with a biasing negative voltage at the output anode 1470, to provide for the establishment and maintenance of the steady-state arc 1424 when either or both inputs at the input cathodes 1486, 1484 are binary 0.

Figure 14C:
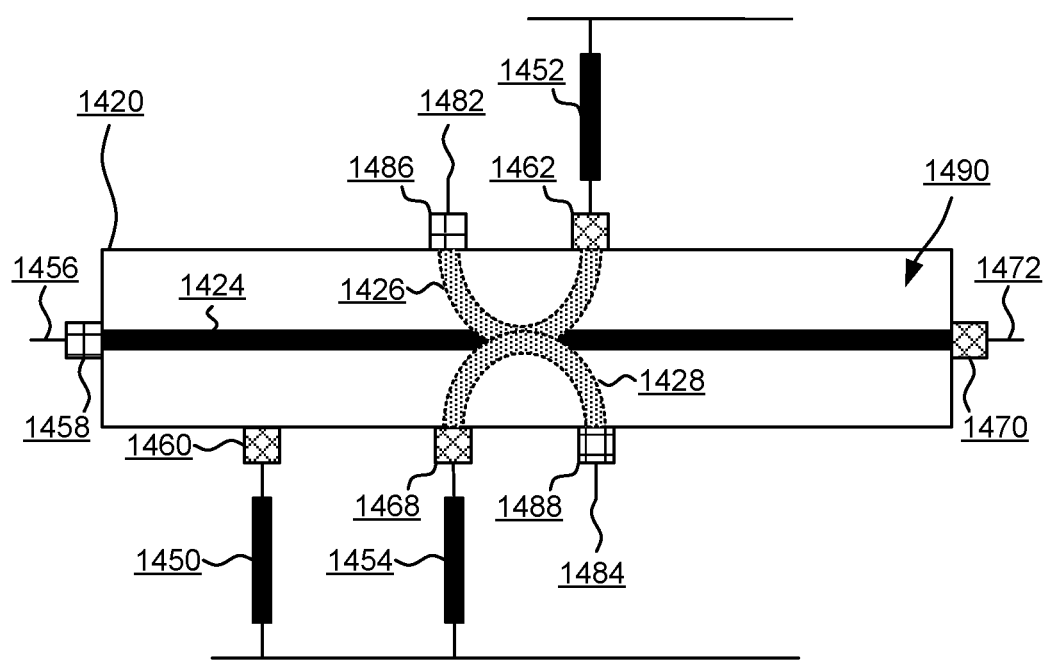
FIG. 14c is a schematic illustration of a logic gate electronic component suitable for production by additive manufacturing processes in accordance with a second alternative embodiment of the present invention.

FIG. 14c is a schematic illustration of a logic gate electronic component suitable for production by additive manufacturing processes in accordance with a second alternative embodiment of the present invention. Many of the elements of FIG. 14c are identical to like-numbered features of FIGS. 14a and 14b though in FIG. 14c these features are arranged differently. The arrangement of FIG. 4c is similar to that of FIG. 14b except that the input cathodes 1486, 1462 are arranged directly or almost directly opposite output anodes 1468, 1484 so as to generate two arcs 1426, 1428 on occurrence of binary value 1 at each input cathode 1486, 1462 so as to deflect the steady-state arc 1424 with greater certainty. It will be appreciated that the arrangement of FIG. 14c is a modification of the arrangement of FIG. 14b in which the input cathode/drain anode pairs are arranged laterally such that they are generally opposite each other. Notably, in the arrangement of FIG. 14b, when cathode 1486 has binary 1 an arc between cathode 1486 and opposing anode 1468 are precluded by the repulsion of the steady-state arc 1424, and so an arc-shaped arc 1426 is the result. A similar arc-shaped arc 1428 is provided on the opposing wall of the cavity when cathode 1468 has binary 1, and the combination of both arcs serving to deflect the steady-state arc 1424. In practice it will be apparent to those skilled in the art with the benefit of practical experimentation that the lateral displacement of the pairs of cathodes/anodes can be adjusted to provide a most reliable configuration in which the steady-state arc 1424 is deflected on provision of binary 1 to both input cathodes 1486, 1484 and not on provision of binary 1 to only one input cathode.

Figure 14D:
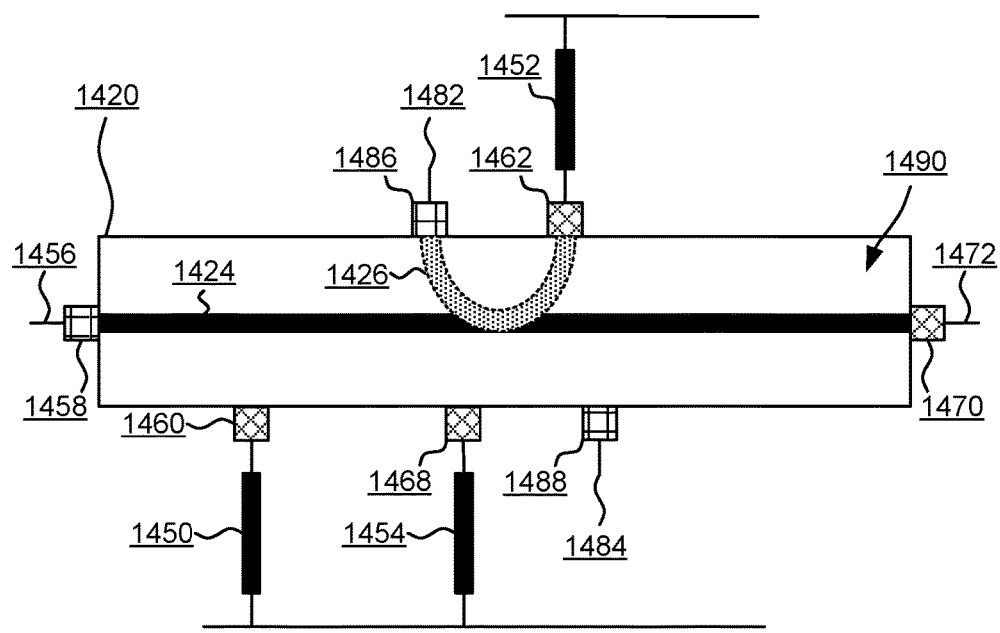
FIG. 14d is a schematic illustration of a logic gate electronic component suitable for production by additive manufacturing processes in accordance with a third alternative embodiment of the present invention.
Figure 14E:
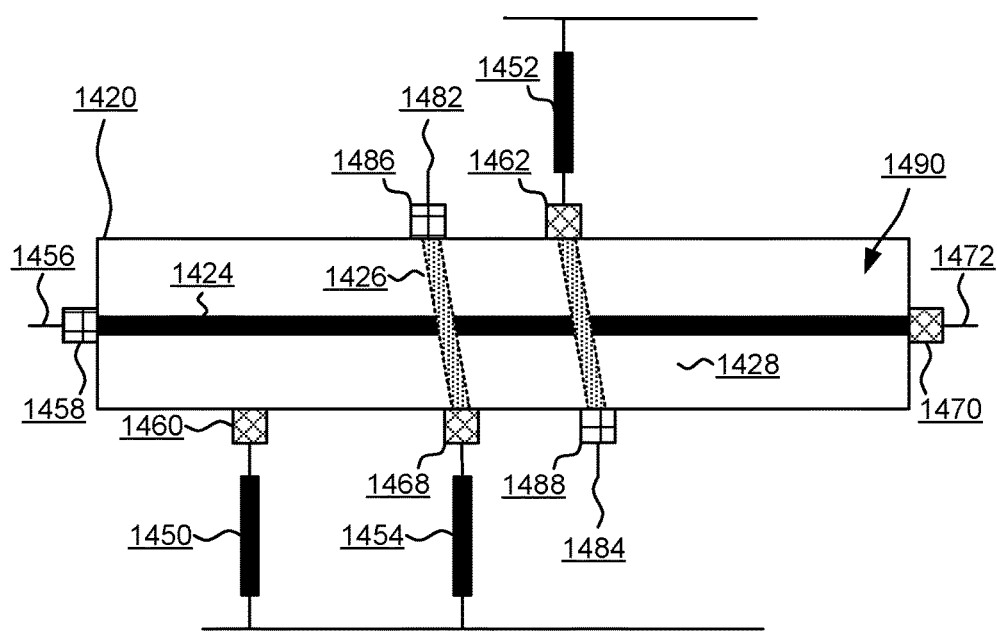
FIG. 14e is a further schematic illustration of the logic gate electronic component of FIG. 14d in accordance with a fourth alternative embodiment of the present invention.

FIG. 14d is a schematic illustration of a logic gate electronic component suitable for production by additive manufacturing processes in accordance with a third alternative embodiment of the present invention. Many of the elements of FIG. 14d are identical to like-numbered features of FIG. 14a though in FIG. 14d these features are arranged differently. The arrangement of FIG. 14d is substantially consistent with that of FIG. 14c where a potential difference is provided only between input cathode 1486 and drain anode 1462 and so a single arc 1426 is formed that is insufficient to deviate the steady-state arc 1424 (and is also insufficient to repel the steady-state arc 1424 sufficiently to constitute an arc to drain anode 1468). However, when a potential difference is provided between input cathode 1488 and drain anode 1468 an alternative outcome can be realised to that of FIG. 14c. FIG. 14e illustrates such alternative outcome in which the combined repulsive effects of arcs emanating from each of the input cathodes 1486, 1484 is sufficient to repel the steady-state arc 1424.

Thus, in use and as summarised with reference to FIGS. 14a to 14d, a continuous potential difference is provided between the steady state cathode 1458 and output anode 1472 to provide the steady state arc therebetween for a flow of current causing a HIGH output signal at electrical connection 1472 indicative of a binary value 1. Where no or low potential difference (i.e. a potential difference insufficient to induce an arc even without the steady state arc) exists between input cathodes 1486, 1488 and respective anodes 1462, 1468 then the continuous electric discharge as the steady state arc between the steady state cathode 1458 and the output anode 1470 is maintained and the NAND gate 1420 outputs a HIGH signal at output connection 1472 indicative of binary value 1.

Where a HIGH signal is received and a potential difference exists between only one of the input cathodes 1486, 1488 and respective anodes 1462, 1468, such potential difference is insufficient to overcome the steady state discharge between the steady state cathode 1458 and the output anode 1470. Where a HIGH signal is received and a potential difference exists between both of the input cathodes 1486, 1488 and respective anodes 1462, 1468, two continuous electric discharges are formed as arcs that is sufficient to deflect the steady state arc. The steady state arc thus ceases to provide current flow between the steady state cathode 1458 and the output anode 1470 and the NAND gate 1420 outputs a LOW signal at output connection 1472 indicative of binary 0. In a preferred embodiment, a drain anode 1460 is provided for continuous electric discharge between the steady state cathode 1456 and the drain anode 1460 in the event of deflection of the steady state arc.

Figure 15A:
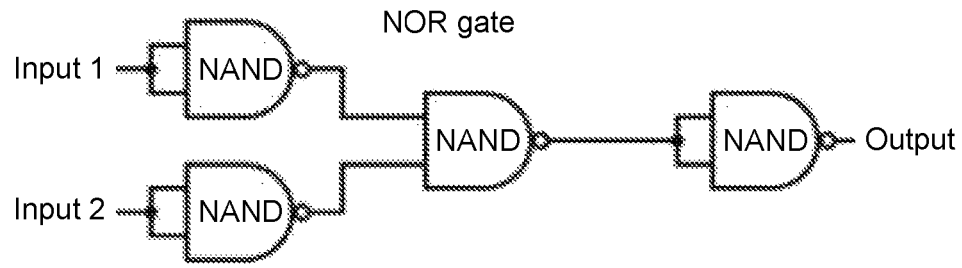
FIGS. 15a to 15e illustrate various arrangements of NAND gates to form other logic gates.
Figure 15B:
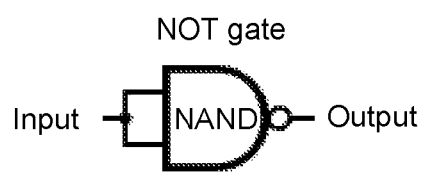
Figure 15C:
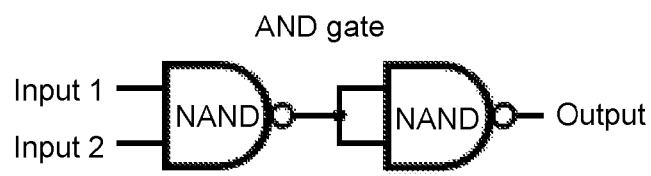
Figure 15D:
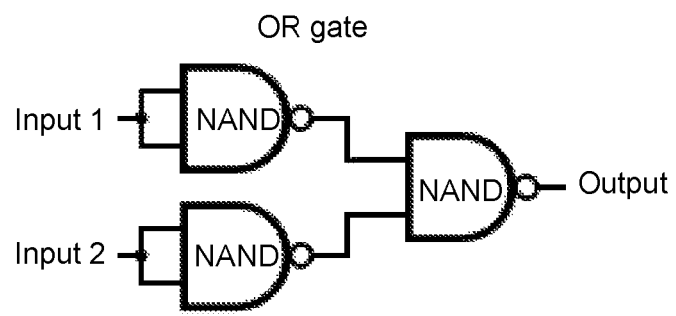
Figure 15E:
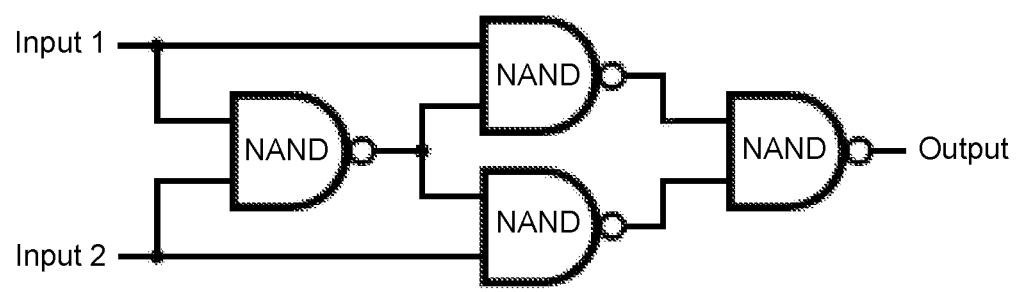

Thus it can be seen that a three dimensional article manufactured using additive manufacturing techniques to provide a logic gate arranged in accordance with FIG. 14 will provide NAND gate operations such that an output signal of HIGH (binary 1) is provided unless input signals of HIGH (binary 1) are supplied to both input connections 1482, 1484. While the NAND gate 1420 of FIG. 14 is illustrated including a cavity 1490 of a particular rectangular shape it will be appreciated that other shaped cavities could be employed including three dimensional multi-sided cavities or cylindrical cavities provided the arrangement of the electrodes is such as to provide the function of the NAND gate by interference of the electrical arcs as described above. Furthermore, other cathode and anode arrangements to provide other logic gates such as NOT, AND gates and NOR gates will be apparent to those skilled in the art. In particular FIG. 15a illustrates an arrangement of NAND gates to form a NOR gate. FIG. 15b illustrates an arrangement of a NAND gate to form a NOT gate. FIG. 15c illustrates an arrangement of NAND gates to form an AND gate. FIG. 15d illustrates an arrangement of NAND gates to form an OR gate. FIG. 15e illustrates an arrangement of NAND gates to form an XOR gate. Thus embodiments of the present invention provide for the additive manufacturing of all variations of logic gates permitting the manufacture of logical circuits, computational devices, decision making circuits, signal processing circuits and the like all enjoying the benefits of additive manufacturing processes. For example such 3D printed logic gates can provide: multiplexers; registers; arithmetic logic units; computer memory; processors; switches and the like.

In one embodiment fluid communication channels such as the channel 706 of FIG. 7 are provided with a three dimensional article manufactured including a logic gate such as described above. Where a logic gate is formed using continuous electric discharge of a gas, and in contrast to the description above with respect to FIG. 7, it is necessary that a gas exists in the cavity formed in the perforated layer 704. Accordingly, the evacuation port 702 of FIG. 7 is a fluid port suitable for inserting gas into the cavity. Thus after additive manufacture of the article the fluid port is used to insert gas such as inert gas or gas mixture into the cavity. Such fluid port may be used to evacuate the cavity before inserting such gas and so may still provide an evacuation function in addition to a gas insertion function.

A method of manufacture of an article with integral logic gate can be implemented by a system substantially as described above with respect to FIG. 10. Such a method includes substantially the steps of the method of FIG. 11 such that the particular electrode arrangements are provided for a required logic gate. Preferably, the method of FIG. 11 further includes the additive manufacture of a stabilising resistor as a resistive material electrically connected to an electrode of a logic gate circuit to stabilise the negative voltage-current characteristics of continuous electric discharges occurring in the cavity of the logic gate. Alternatively other passive stabilising devices could be employed in the circuit of the arc.

Insofar as embodiments of the invention described are implementable, at least in part, using a software-controlled programmable processing device, such as a microprocessor, digital signal processor or other processing device, data processing apparatus or system, it will be appreciated that a computer program for configuring a programmable device, apparatus or system to implement the foregoing described methods is envisaged as an aspect of the present invention. The computer program may be embodied as source code or undergo compilation for implementation on a processing device, apparatus or system or may be embodied as object code, for example.

Suitably, the computer program is stored on a carrier medium in machine or device readable form, for example in solid-state memory, magnetic memory such as disk or tape, optically or magneto-optically readable memory such as compact disk or digital versatile disk etc., and the processing device utilises the program or a part thereof to configure it for operation. The computer program may be supplied from a remote source embodied in a communications medium such as an electronic signal, radio frequency carrier wave or optical carrier wave. Such carrier media are also envisaged as aspects of the present invention.

It will be understood by those skilled in the art that, although the present invention has been described in relation to the above described example embodiments, the invention is not limited thereto and that there are many possible variations and modifications which fall within the scope of the invention.

The scope of the present invention includes any novel features or combination of features disclosed herein. The applicant hereby gives notice that new claims may be formulated to such features or combination of features during prosecution of this application or of any such further applications derived therefrom. In particular, with reference to the appended claims, features from dependent claims may be combined with those of the independent claims and features from respective independent claims may be combined in any appropriate manner and not merely in the specific combinations enumerated in the claims.

The invention claimed is:

1. An apparatus manufactured using an additive manufacturing process and having a gas filled sealed cavity containing at least two cathodes and an anode spaced from the cathodes such that a continuous electric discharge of the gas stimulated between at least one of the cathodes and the anode provides a Boolean function output at the anode corresponding to electrical input signals at two of the cathodes, wherein the cathodes and the anode are additively manufactured with the apparatus.

2. The apparatus of claim 1 further comprising an additively manufactured stabilizing resistor as a resistive material electrically coupled to the anode to stabilize the continuous electric discharge.

3. The apparatus of claim 1 wherein the continuous electric discharge of the gas occurs as an electric arc.

4. The apparatus of claim 1 wherein the cavity contains two cathodes such that the Boolean function is an OR function.

5. A 3D printed article comprising one or more of the apparatus of claim 4 as NAND gates within the fabric of the article wherein the NAND gates are arranged to form any number of one or more of: OR, NOT, AND, NOR and XOR logic gates.

6. The apparatus of claim 1 wherein the anode is an output anode and the at least two cathodes include: a control cathode spaced opposing the output anode; and a first and second input cathodes to receive the input signals via additively manufactured electrical signal paths, the apparatus further comprising at least two drain anodes each spaced opposing a respective one of the input cathodes,
wherein a potential difference between the control cathode and output anode stimulates the continuous electric discharge allowing current to flow therebetween,
wherein a potential difference between one of the input cathodes and a respective drain anode is insufficient to deflect the continuous electric discharge allowing current to flow via the output anode, and
wherein a potential difference between both of the input cathodes and the respective drain anodes is sufficient to deflect the continuous electric discharge preventing current flowing via the output anode, such that the Boolean function output at the anode corresponds to a logical NAND operation on the input signals at the input cathodes.

7. The apparatus of claim 6 wherein an axis through the control cathode and the output anode is substantially perpendicular to an axis between the first input cathode and respective drain cathode and also perpendicular to an axis between the second input cathode and respective drain anode.

8. The apparatus of claim 1 wherein the apparatus further comprises an additively manufactured circuit.

9. The apparatus of claim 1 wherein the anode is an output anode and the at least two cathodes include: a control cathode spaced opposing the output anode; and a first and second input cathodes to receive the input signals via additively manufactured electrical signal paths, the apparatus further comprising at least two drain anodes each spaced opposing a respective one of the input cathodes, and
wherein an axis through the control cathode and the output anode is substantially perpendicular to an axis between the first input cathode and respective drain cathode and also perpendicular to an axis between the second input cathode and respective drain anode.

10. A method of manufacturing an article with integral logic gate electronic component comprising:
using an additive manufacturing process to:
a) form an electrically non-conductive substrate;
b) form an electrically non-conductive perforated layer having a cavity;
c) form electrically conductive anode and cathode elements spaced in the cavity including at least two cathodes;
d) deposit an electrically conductive connection to each of the elements sufficient to imparting an electrical potential difference between the elements;
e) form an electrically non-conductive sealing layer atop the perforated layer so as to retain and seal the cavity in the perforated layer,
wherein the cavity contains gas and wherein the electrical potential difference is sufficient to stimulate a continuous electric discharge of the gas between at least one of the cathodes and the anode to provide a Boolean function output at the anode corresponding to electrical input signals at two of the cathodes.

11. The method of claim 10 wherein forming one or more of: the substrate; perforated layer; and sealing layer includes forming a channel providing fluid communication between the cavity and a fluid port of the article, wherein the fluid port via which the gas can be inserted into the cavity.

12. The method of claim 10 wherein the additive manufacturing process takes place within a sealed atmosphere constituted substantially of an inert gas so as to encase the inert gas in the cavity on formation of the sealing layer.

13. The method of claim 10 wherein the anode is positioned at a side of the cavity opposing a side at which the cathodes are positioned such that the logic gate constitutes a Boolean OR function of the electrical input signals.

14. The method of claim 10 wherein the anode is an output anode and the at least two cathodes include: a control cathode formed spaced opposing the output anode; and a first and second input cathodes formed to receive the input signals via additively manufactured electrical signal paths, the method further comprising forming at least two drain anodes each spaced opposing a respective one of the input cathodes,
  wherein a potential difference between the control cathode and output anode stimulates the continuous electric discharge allowing current to flow therebetween,
  wherein a potential difference between one of the input cathodes and a respective drain anode is insufficient to deflect the continuous electric discharge allowing current to flow via the output anode, and
  wherein a potential difference between both of the input cathodes and the respective drain anodes is sufficient to deflect the continuous electric discharge preventing current flowing via the output anode, such that the Boolean function output at the anode corresponds to a logical NAND operation on the input signals at the input cathodes.

15. The method of claim 10 wherein the additive manufacturing process includes one or both of an extrusion deposition process and a granular material binding process.

16. The method of claim 10 wherein at least one of the: electrically non-conductive substrate; perforated layer; and sealing layer are formed in ceramic.

17. The method of claim 10 wherein at least one of the anode and the cathodes are formed from a gallium alloy.

18. An article with integral logic gate electronic component manufactured by the process of claim 10.

19. An additive manufacturing apparatus for manufacturing an article with integral active electronic component, the apparatus comprising:
  a computer system;
    a first additive manufacturing component adapted to form electrically non-conductive three dimensional structures;
    a second additive manufacturing component adapted to form electrically conductive three dimensional structures;
    wherein the first and second additive manufacturing components are operable under control of the computer system, the computer system being adapted to control the components to:
    a) form an electrically non-conductive substrate;
    b) form an electrically non-conductive perforated layer having a cavity;
    c) form electrically conductive anode and cathode elements spaced in the cavity including at least two cathodes;
    d) deposit a conductive electrical connection to each of the elements sufficient to imparting an electrical potential difference between the elements;
    e) form an electrically non-conductive sealing layer atop the perforated layer so as to retain and seal the cavity in the perforated layer,
  wherein the cavity contains gas and wherein the electrical potential difference is sufficient to stimulate a continuous electric discharge of the gas between at least one of the cathodes and the anode to provide a Boolean function output at the anode corresponding to electrical input signals at two of the cathodes.

20. A computer system for controlling an additive manufacturing apparatus, the additive manufacturing apparatus being adapted to manufacture three dimensional structures from both electrically non-conductive and electrically conductive materials, the computer system being operable to control the additive manufacturing apparatus to perform the method of claim 10.

* * * * *